United States Patent [19]

Yoshinaka et al.

[11] Patent Number: 5,066,475

[45] Date of Patent: * Nov. 19, 1991

[54] ZINC OXIDE WHISKERS HAVING A NOVEL CRYSTALLINE FORM AND METHOD FOR MAKING SAME

[75] Inventors: Minoru Yoshinaka; Eizo Asakura, both of Osaka; Toshihiro Misaki, Takarazuka; Motoi Kitano, Kawanishi; Hideyuki Yoshida, Amagasaki, all of Japan

[73] Assignee: Matsushita Electric Industrial Co., Ltd., Osaka, Japan

[*] Notice: The portion of the term of this patent subsequent to Oct. 2, 2007 has been disclaimed.

[21] Appl. No.: 291,611

[22] Filed: Dec. 29, 1988

[30] Foreign Application Priority Data

Dec. 29, 1987 [JP] Japan ................................ 62-334418
Feb. 24, 1988 [JP] Japan ................................ 63-41329
Feb. 24, 1988 [JP] Japan ................................ 63-41330

[51] Int. Cl.$^5$ ............................................. C01G 9/02
[52] U.S. Cl. ..................................... 423/622; 428/614
[58] Field of Search ................. 423/622, 623; 428/614

[56] References Cited

U.S. PATENT DOCUMENTS

| 2,267,720 | 12/1941 | Cyr | 423/158 |
|---|---|---|---|
| 2,331,599 | 10/1943 | Cyr | 423/623 |
| 3,096,155 | 7/1963 | Gordon et al. | 423/623 |
| 4,960,654 | 10/1990 | Yoshinaka et al. | 428/614 |

FOREIGN PATENT DOCUMENTS

| 50-5597 | 1/1975 | Japan . | |
| 50-6597 | 1/1975 | Japan . | |
| 6120518 | 2/1980 | Japan . | 423/622 |
| 60-5529 | 2/1985 | Japan . | |

OTHER PUBLICATIONS

Matsushita et al, "Growth of Zno Needle Crystals by Vapor Phase Reaction Method", Journal of Crystal Growth, vol. 26, No. 1, Nov. 1974, pp. 147-148.
Chemical Abstracts, vol. 101, No. 6, Aug. 1984, p. 117, Abstract No. 40553t, Columbus, Oh., US; O. Sakurai et al.: "Formation of Needle-Like Zinc Oxide Particles and the Analysis of Particle Morphology", & Nippon Kagaku Kaishi 1984 (6), 837-842.
Journal of Applied Physics, vol. 42, No. 13, Dec. 1971, pp. 5302-5304; S. D. Sharma et al.: "Growth of ZnO Whiskers, Platelets, and Dendrited".
Comptes Rendus Hebdomadaires des Seances de L'Academie des Sciences, vol. 270, Serie B, 12th Jan. 1970, pp. 170-173, Paris, FR; M. A. Billmann et al.: "Croissance en phase vapeur de monocristaux d'oxyde de zinc".
"Structure and Growth of ZnO Smoke Particles Prepared by Gas Evaporation Technique", by Makoto Shiojiri et al; Journal of Crystal Growth 52 (1981), pp. 173-177.
Shiojiri et al, "Structure and Growth of ZnO Smoke Particles Prepared by Gas Evaporation Technique", *Journal of Crystal Growth* 52 (1981), pp. 173-177.
Jones, "A Mechanism for the Formation of Dislocations in ZnO Single Crystals", *Journal of Crystal Growth* 8 (1971), pp. 63-68.
Cowley et al, "The Morphology of Zinc Oxide Smoke Particles", *Proc. Phys. Soc.* (London), B64 (1951), pp. 638-644.
Fuller, "Twinning in Zinc Oxide", *Journal of Applied Physics*, vol. 15 (Feb. 1944), pp. 164-170.
Sears, "Structure of Zinc Oxide", *J. Chem. Phys.*, 39 (1963), pp. 2248-2251.
"Influences of Crystal Gorm on Propylene Oxidation Activity of Zinc Oxide", *Journal of the Chemical Society of Japan* (1978), No. 6, pp. 811-816.
"Formation of Needle-like Zinc Oxide by Vapor Phase Oxidation and Analysis of Particle Form", *Journal of the Chemical Society of Japan* (1984), No. 6, pp. 837-842.

*Primary Examiner*—Michael Lewis
*Assistant Examiner*—Brian M. Bolam
*Attorney, Agent, or Firm*—Lowe, Price, LeBlanc & Becker

[57] ABSTRACT

Whiskers of zinc oxide whose crystal structure includes a central body and four needle crystal projections radially extending from said central body are described. The whiskers are so unique a structure that they are applicable to various materials such as metals, resins, ceramics and the like as a reinforcing material. The whiskers may be in the form of a mixture of whiskers of zinc oxide having crystal structures including two, three, four and/or five needle crystal projections. A method for preparing such whiskers is also described.

63 Claims, 3 Drawing Sheets

10μm

10μm

1 μm

ZINC OXIDE WHISKERS HAVING A NOVEL CRYSTALLINE FORM AND METHOD FOR MAKING SAME

BACKGROUND OF THE INVENTION

1. Field of the Invention

This invention relates to whiskers of zinc oxide having a hitherto unknown crystalline structure or form which has at least two needle-like crystals radially extending from a central part or body. The invention also relates to a method for making whiskers having such a novel form as mentioned above. The whiskers of the novel form or structure have wide utility as additives in various fields of electrophotography, electronic parts such as varistors and ferrites, a vulcanization accelerator for rubbers, fillers or pigments for paints, inks, synthetic resins, medicines, paints, cosmetics, ceramics and the like. In addition, the whiskers may be utilized as a reinforcing agent for metals, ceramics, resins and the like and also as a filter material, a carrier for catalyst, humidity and gas sensors, an electromagnetic shielding material, an electric conductor and the like.

2. Description of the Prior Art

Zinc oxide currently employed as a general-purpose industrial material is one which is produced by a so-called French process. The zinc oxide obtained by this process consists of particles having different shapes and sizes.

Japanese Patent Publication No. 60-5529 describes a process of forming needle crystal particles of zinc oxide in high yield. This process is an improvement of the French process in which metallic zinc vapor is quenched, in which fine needle crystals having a length of from 0.5 to 1.5 micrometers are obtained without formation of large-sized crystals. The needle crystals of zinc oxide are smaller in size in about two orders of magnitude than other industrially employed whiskers of other materials commerically available at present. Usually, whiskers have commonly a great effect of reinforcing metals, ceramics and resins. However, the needle crystals of zinc oxide as mentioned above exhibit only such a low level as ordinary zinc oxide particles with respect to the reinforcing effect, and are thus unsatisfactory as whiskers. More particularly, whiskers which are made of fibrous single crystals have significantly greater mechanical strength than crystal particles for the same material. This is the reason why whiskers have attracted attention for use as a reinforcing material in order to attain high mechanical strength by incorporation into other materials. At present, whiskers for industrial purposes such as of metals, metal oxides, metal carbides, metal nitrides and the like have been commercially sold.

However, these known whiskers have several problems. One of the problems is that because of a small growth rate, the production costs become high. Another problem is that since the whiskers have a simple fibrous form, it is very difficult to uniformly disperse the fibrous whiskers three-dimensionally in matrix materials such as resins or metals. When the dispersion is formed or shaped, the whiskers are liable to be arranged along the direction of melt flow of the matrix. The resultant composite material eventually exhibits anisotropy in characteristics.

Whiskers of zinc oxide having a length in the order of millimeters are set out in Japanese Laid-open Patent Application No. 50-6597. These whiskers are produced from zinc alloys with the following disadvantages: the whiskers inevitably contain impurities in the crystals and have to be grown on a substrate; the yield is low; and apparatus and operations for making the whiskers are complicated with a long-term heating treatment being required. Thus, the whiskers are obtained only experimentally rather than industrially.

SUMMARY OF THE INVENTION

It is therefore an object of the invention to provide zinc oxide whiskers having a novel crystal form which are particularly useful as an additive or reinforcing agent for various materials such as metals, ceramics, plastic resins and the like.

It is another object of the invention to provide zinc oxide whiskers having a novel crystal form of a larger-sized tetrapod form as never known in the art whereby compositions comprising the whiskers exhibit significantly improved mechanical, chemical and electrical properties without showing any anisotropy with respect to the characteristic properties.

It is a further object of the invention to provide zinc oxide whiskers each having fundamentally four needle-like single crystal projections extending from a central part and having a size far larger, e.g. in about two orders of magnitude, than known fine needle crystals of zinc oxide whereby the effect of reinforcement of metals or resins becomes pronounced.

It is a still further object of the invention to provide a method for manufacturing in high yield zinc oxide whiskers of such a form as mentioned above.

It is an additional object of the invention to provide a method for manufacturing zinc oxide whiskers more inexpensively than the manufacture of silicon carbide or silicon nitride whiskers used for the same purposes.

In accordance with one embodiment of the invention, there are provided whiskers of zinc oxide in a crystal form which has a central body and four needle crystal projections radially extending from the body. Each crystal projection has a length of not less than 3 micrometers as determined from a basal part to the tip thereof. The basal part means a portion at which the projection connects the central body. Each needle crystal projection should preferably have a length of from 3 to 300 micrometers and more preferably from 30 to 200 micrometers. In addition, each projection should preferably have a diameter at the basal part, associated with the central body, of from 0.5 to 14 micrometers, preferably from 1 to 14 micrometers and most preferably from 1.5 to 14 micrometers. In a typical and preferable embodiment, the four needle crystal projections extend in such a way that any adjacent two projections fundamentally make an angle of approximately 109° and the four needle crystal projections are radially extended so that when the tips of any three projections are in contact with a horizontal plane, the other projection extends substantially uprightly or in an upward direction. Accordingly, the whisker material of the invention may be often called "tetrapod whisker" hereinafter. Moreover, there is also provided a mixture of whiskers of zinc oxide which comprises a major proportion of whiskers each having a central body and four needle crystal projections radially extending from the body with the balance of whiskers having individually a central body and two, three and/or five needle crystal projections extending the central part.

The whiskers of zinc oxide described above may be used as an additive or reinforcing agent for various materials such as a vulcanization accelerator for rubbers, and a pigment for paints, inks, synthetic resins, medicines, paints, cosmetics, ceramics and the like. Various compositions comprising the novel whiskers are within the scope of the invention.

In accordance with another embodiment of the invention, there is also provided a method for manufacturing a whisker material of zinc oxide which comprises providing a metallic zinc powder having an oxide film thereon, and subjecting the powder to thermal treatment in an atmosphere containing molecular oxygen under conditions sufficient to form a product comprising whiskers of zinc oxide having a crystal form including a central body and four needle crystal projections extending radially from the central body. The zinc powder having an oxide film thereon is preferably formed by grinding or milling the metallic zinc powder in water, or allowing the zinc powder to stand in water for aging until an oxide film is formed on the powder, or by combination of the grinding and the aging. Alternatively, the zinc powder may be formed by a melt spraying method under oxidative conditions, or by mechanical grinding or a vaporization and condensation technique under oxidative conditions whereby an oxide film is formed on the powder.

BRIEF DESCRIPTION OF THE INVENTION

FIGS. 5 through 13 are, respectively, electron micrographs of zinc oxide whiskers obtained in examples of the invention; and FIGS. 14 through 18 are, respectively, electron micrographs of zinc oxide crystals for reference or comparison.

DETAILED DESCRIPTION AND EMBODIMENTS OF THE INVENTION

Figure 1:
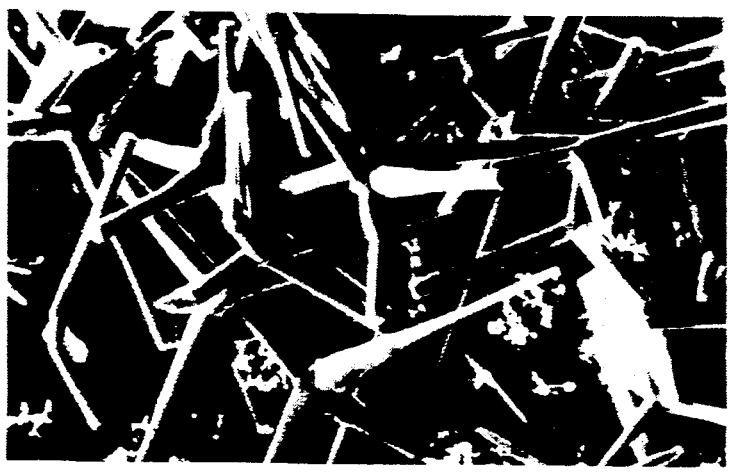
FIG. 1 is an electron micrograph of zinc oxide whiskers according to the invention.

Zinc oxide whiskers of the present invention are characterized in the specific structure which has a central body and four needle crystal projections radially extending from the body. Each crystal projection has a length of not less than 3 micrometers when it is determined as from the basal part to the tip of the projection. The length is preferably from 3 to 300 micrometers. From the standpoint of characteristic properties in certain fields where high physical properties are required, the length is more preferably in the range of from 10 to 300 micrometers and most preferably from 30 to 300 micrometers. Moreover, each projection should preferably have a diameter of from 0.5 to 14 micrometers, more preferably from 1 to 14 micrometers and most preferably from 1.5 to 14 micrometers, at the basal part thereof. In the practice of the invention, four needle crystal projections extend in such a way that any adjacent two projections fundamentally make an angle of approximately 109°. The reason why any adjacent two projections fundamentally make such an angle as indicated above is that the basal parts of the projections are sometimes twisted so that an apparent angle may not correctly make 109°. The whiskers of zinc oxide of the invention have been described as having such a crystal form that it includes a central body with four radially extending sound single crystal projections. In most cases, the whiskers of zinc oxide are obtained as a mixture of whiskers each having four radially extending crystal projections from a central body and whiskers which have two, three and/or five radially extending crystal projections from a central body. These mixed whiskers are also within the scope of the invention. In this connection, the whiskers each having four radially extending crystal projections are a main component of the mixture and are usually contained in amounts of not less than 60% of the mixed whisker product when counted through a micrograph. The reason why such a mixture is formed is considered as follows: one or two crystal projections are broken during formation of the whiskers or are not grown for the reason which is not known at present; and with five projections, a broken projection deposits and grows on a sound whisker having normal four needle crystal projections.

The whiskers of zinc oxide according to the invention may be applied to various materials such as metal, ceramics including metal oxides, natural or synthetic resins for use as an additive or a reinforcing agent therefor. Since the radially extending needle projections from a central body of the whisker exist, compositions comprising such whiskers exhibit little anisotropy with respect to physical, chemical and electric properties as will be particularly described in examples with respect to the physical properties.

Preparation of the zinc oxide whiskers having such a unique crystal form is described.

Broadly, the zinc oxide whiskers of the invention can be obtained by thermally treating or baking metallic zinc powder or particles each having an oxide film on the surfaces thereof in an atmosphere containing molecular oxygen. It is important that the metallic zinc powder or particles be used in the practice of the invention. This is completely different from prior art techniques of obtaining zinc oxide whiskers of a needle crystal form wherein it is usual to use an ingot of metallic zinc. The metallic zinc powder having a zinc oxide film thereon according to the invention should preferably have a size of from 0.1 to 500 micrometers, preferably from 10 to 300 micrometers.

The metallic zinc powder used in the present invention may be broadly obtained by (1) a melt-quenching technique, (2) a mechanical technique and (3) a physical or chemical technique. The technique (1) includes, for example, a melt-spraying method in which a zinc wire or powder is melt-sprayed into air by means of an arc flame spraying apparatus, or a shooting or graining method or an atomizing method in which a melt of zinc is converted into a powder, particles or flakes. The powder, particles or flakes may be further divided into finer pieces. The metallic zinc powder obtained by these methods has a oxide film thereon to a degree and may be used as it is for subsequent baking operation.

In the technique (2), an ingot of metallic zinc is used and is subjected to mechanical grinding or cutting wherein the ingot is cut or roughly broken into pieces, for example, in a jaw crusher or a gyratory crusher. The roughly crushed or cut pieces are subsequently milled into pieces of finer sizes by known devices such as a stamp mill, a vortex mill and the like. For obtaining finer pieces, the resultant powder may further treated in a hammer mill, a cutting mill, a micronizer or the like.

Still alternatively, the starting zinc powder may be one which is obtained by the technique (3) utilizing electrolysis, evaporation and/or coagulation.

In usual practice, care is directed to the formation of zinc powder which is free of any oxide film on the surfaces thereof. In the practice of the invention, the powder of zinc is so prepared that a zinc oxide film is formed on the surfaces of the powder. Accordingly, the above procedures of forming the zinc powder may be effected in coexistence of water, in an oxygen-rich atmosphere or in air, or in a high humidity condition especially for the techniques (2) and (3). Moreover, a zinc powder suitable for the purposes of the invention may be obtained when it is prepared under high temperature and high mechanical stress conditions.

In order to cause the zinc oxide film to be conveniently formed on the individual particles of zinc, the following procedures are preferably used. Metallic zinc particles obtained by any technique set forth above are subjected to mechanical treatment in or in coexistence of water for wetting the powder and are dried to remove the water from the surfaces of the powder. The mechanical treatment may be effected, for example, using an automated mortar or a roll mill. By the treatment, the mechanical pressure can be exerted on the particles to facilitate the oxidation. The mechanical treatment in or in coexistence of water is generally effected for at least 20 minutes, preferably at least 60 minutes. Moreover, it is preferred to subsequently age the mechanically treated particles in water for not shorter than 24 hours, preferably not shorter than 72 hours. The aging treatment over 72 hours or longer ensures formation of the oxide film irrespective of the particle size of zinc used. The aging should be preferably effected at a temperature of not lower than 20° C. It should be noted that the formation of the oxide film is possible only by the use of the aging or chemical reaction, not using the above-mentioned mechanochemical reaction. However, the chemical reaction undesirably takes a long time before formation of the oxide film.

The formation and growth of the oxide film are influenced by a number of factors, which may be summarized below.

(1) Mechanical pressure
(2) Oxidation reaction in water or under high humidity conditions
(3) Synergistic effect of (1) and (2) above (mechanochemical reaction)
(4) Concentration of oxygen in a treating system
(5) Treating temperature Among the above factors, the mechanochemical reaction (3) greatly influences the size of produced whiskers, particularly the length of the needle crystals although a short reaction time may be sufficient to obtain whiskers having relatively long lengths of the crystal projections. A longer grinding or milling time in water tends toward a larger size of the whiskers. The reason why the oxide film is necessary on the individual zinc particles is considered as follows. When baked or thermally treated at temperatures higher than the melting point of metallic zinc, the oxide film can suppress a melt of metallic zinc from release from the inside of the individual particles and/or can suppress too rapid migration of oxygen into the inside of the metallic zinc particles. This allows an ample time sufficient to cause a single crystal to be grown. Thus, zinc oxide whiskers of a large-sized tetrapod form, which has never been expected in ordinary gas phase methods, can be formed.

The thus treated zinc particles are allowed to stand in air for drying. Alternatively, the particles may be heated for drying at temperatures lower than a melting point of metallic zinc to remove the water from the surfaces of the particles. More particularly, the drying is effected to such an extent as to prevent any troubles when the particles are subjected to a subsequent thermal treatment or baking where high temperatures are used. If the water were not removed, there might occur breakage of a crucible or scattering of the particles or powder. The dried powder or particles are subsequently placed in a suitable container such as a crucible or in a furnace where they are heated in an atmosphere containing molecular oxygen under conditions sufficient to cause oxidation, crystalization and crystal growth, thereby forming whiskers of the tetrapod form. In practice, the thermal treatment is effected at a temperature of from 700° to 1300° C., preferably from 900° to 1100° C. Within this temperature range, whiskers having a unique structure are obtained in high yield irrespective of the particle size of the starting powder within the afore-defined range.

The baking or thermal treatment time is generally in the range of 20 to 120 minutes for the temperature of from 700° to 1300° C., and preferably 30 to 90 minutes for the temperature of from 900° to 1100° C. More preferably, the sintering conditions include a temperature of 700° to 900° C. correspondingly for a time of from 120 to 20 minutes and most preferably a temperature of from 900° to 1100° C. correspondingly for 90 to 30 minutes. The thermal treatment is effected in an atmosphere containing molecular oxygen, e.g. air. Preferably, a mixed gas containing nitrogen and oxygen in a controlled mixing ratio may be used. In this case, the oxygen content is from 0.01 to 11 vol %, preferably from 0.1 to 3 vol %.

The resultant zinc oxide whiskers having such a unique structure as described before are formed in situ or in the place where the starting powder has been treated. The metallic zinc covered with the oxide film is not vaporized as in the case of prior art needle-like whiskers of zinc oxide and is converted into zinc oxide whiskers in situ. The zinc oxide whiskers have a very low apparent bulk density as will be set out hereinafter, so that the volume in the reaction system abruptly increases. The yield of the whiskers is very high, i.e. not lower than 40 wt % of the starting powder. The balance is particles or granules of zinc oxide, which are considered to be mainly composed of the oxide film formed on the starting powder. The zinc oxide particles are usually formed at a lower portion of a reaction system as a layer because the apparent bulk density of the whiskers is very small, say, from 0.05 to 0.45. Accordingly, the whiskers can be readily separated from the particles. If desired, however, the particles may be used along with the whiskers for use as an additive.

The whiskers having the four projections are usually obtained in an amount of from 60 to 97% by number of the total whisker product. The amount may vary depending upon the thermal treatment conditions and the like.

As described before, the starting metallic zinc powder is treated so that an oxide film is formed on the surfaces thereof such as by mechanochemical treatment in a mortar or with rolls in water. The oxide film may be caused to further grow when aged in water. The formation of the oxide film has been confirmed by X-ray diffraction analysis. The oxide film or the treatments for the formation of the film are considered to contribute to the development of the specific type of large-sized whisker. This has been confirmed by comparison with the case where metallic zinc which has been prepared by a process wherein zinc powder undergoes no oxidation and has thus no oxide film thereon is used or the case where metallic zinc is used which is in a complete dry condition so that the zinc powder has a very thin passive film incapable of being detected by X-ray diffraction analysis. When these metallic zinc powders are thermally treated or baked under conditions defined before, inhomogeneous baking takes place. Even though temperatures and oxygen concentrations are varied in wide ranges, there is produced only a mixture of zinc oxide particles and uncombusted metallic zinc without formation of whiskers.

On the other hand, with zinc powder having a grown oxide film thereon, the high temperature baking proceeds uniformly and fully to such an extent that the metallic zinc is completely oxidized. This entails growth of giant tetrapod whiskers in very high yields.

Although it is ideal that the metallic zinc powder is completely covered with the oxide film on the surfaces thereof, tetrapod whiskers may be obtained if the oxide film is only partially, not fully, formed on the powder.

When the powder is thermally treated or baked in a manner as described before, the reaction is completed in a container wherein the starting powder is placed, so that the resultant whiskers are accumulated in the container. More particularly, the reaction system drastically increases in volume as compared with an apparent volume of the starting powder. In known gas phase growth techniques, it is usual that needle-like whiskers develop and grow as deposited on a separate member outside a container where a starting powder is placed. In the practice of the invention, the starting powder is converted into the whiskers in situ along with a small proportion of particles and thus, the volume in the container increases with an increase of the resultant whiskers. The size of the whiskers may vary depending upon several factors including a grinding time during which mechanical pressure is exerted on the starting metallic zinc powder in water as described before. This will be particularly described in examples.

The zinc oxide whiskers of the invention contains, aside from the structure including the above typical four radially extending needle crystal projections from the body, a minor amount of whiskers having two, three and/or five radially extending needle crystal projections. This is considered to result from breakage of part of the projections or termination of the growth owing to the contact with other whiskers during or after the course of the growth as described before. In an extreme case, one whisker on the way of growth deposits on another complete tetrapod whisker, resulting in a kind of composite whisker. Accordingly, such specific whiskers are also within the scope of the invention. As a matter of course, crystals of other types such as, for example, plate crystals may be deposited at the needle projections of the whiskers. In this connection, however, according to the method of the invention, tetrapod whiskers are mainly produced.

In the practice of the invention, the whiskers of the unique structure may be further subjected to a procedure such as milling. By the milling, the radially extending needle crystal projections are broken or cut at the basal or other part to obtain needle-like single crystals of zinc oxide. The single needle crystals exhibit a similar tendency as currently developed rod whiskers with respect to characteristic properties. These needle-like single crystals have a reinforcing effect but are inferior in anisotropy of mechanical characteristics to the whiskers prior to the milling.

The whiskers obtained by the method of the invention are a mixture of whiskers having different sizes. For obtaining whiskers with a desired range of size, a centrifugal separation technique or dispersion in liquid may be used so that whiskers having a size smaller than an intended size can be conveniently removed. Thus, zinc oxide whiskers having a size defined before can be readily collected.

The present invention is more particularly described by way of examples.

EXAMPLE 1

A wire of pure metallic zinc having a purity of 99.99% was sprayed in air by an arc flame spraying method to collect 1 kg of the metallic zinc powder. This powder was charged into 500 g of ion-exchanged water and ground in an automated mortar for about 20 minutes. Subsequently, the powder was allowed to stand in water at 26° C. for 72 hours. After the standing in water, the powder was separated from the water and dried at 150° C. for 30 minutes to remove the water from the powder surfaces. The thus dried powder was placed in a crucible, which was in turn placed in an oven maintained at 1000° C. for thermal treatment for 1 hour.

As a result, zinc oxide particles were deposited as a layer in the lower portion of the crucible and the whiskers of zinc oxide having an apparent bulk density of 0.09 were obtained in the upper portion of the crucible. The whiskers were obtained at a rate of 86 wt % of the total product. The electron micrograph of the thus obtained zinc oxide whiskers is shown in FIG. 1. The figure reveals that the whiskers have each a body and four radially extending needle crystal projections and are thus in the form of a tetrapod. The basal part of the needle crystal projections had a diameter of from 1 to 10 micrometers and the length of the projections was in the range of from 10 to 200 micrometers. Although whiskers having three or two projections were found, it was considered that these whiskers were formed after breakage of the four needle crystal projections. The electron micrograph revealed deposition of plate crystals on the whiskers which were small in amounts. The yield of the tetrapod whiskers was about 80% by number based on the whisker product.

Figure 2:
FIG. 2 is an electron micrograph of zinc oxide whiskers after grinding.
Figure 3:
FIG. 3 is an enlarged electron micrograph of the whiskers of FIG. 2.

The whiskers obtained in the above procedure was subsequently milled in a ball mill for 24 hours. The electron micrograph of the milled whiskers is shown in FIG. 2 and the milled whiskers are enlarged in FIG. 3.

Figure 4:
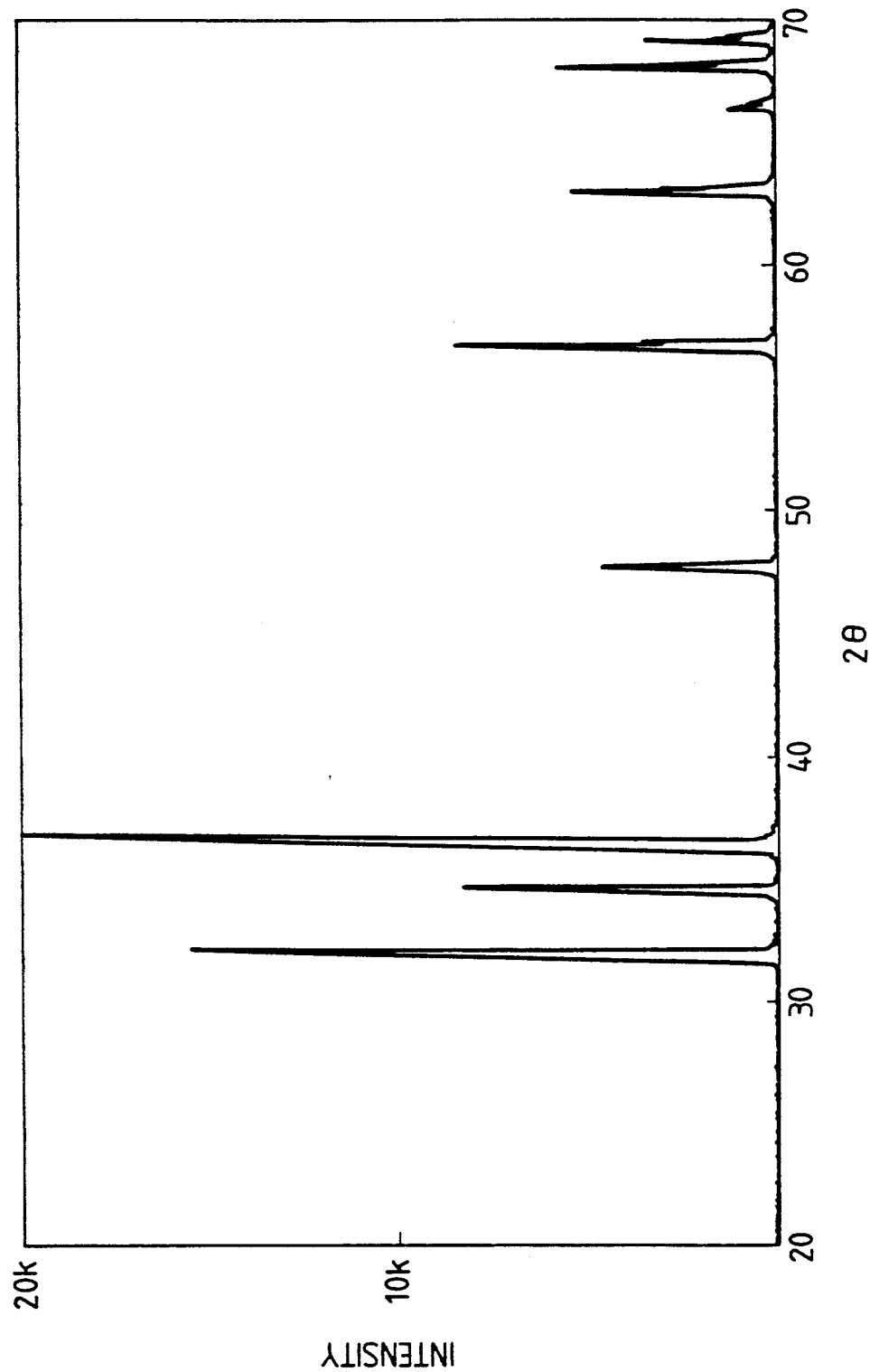
FIG. 4 is an X-ray diffraction pattern of the zinc oxide whiskers of FIG. 1.

FIG. 4 is an X-ray diffraction pattern of the whiskers obtained in Example 1, revealing that all the peaks are those of zinc oxide. Moreover, the whiskers were also subjected to electron beam diffraction analysis, showing that the whiskers exhibited single crystallinity and involved little transformation or rearrangement and lattice defects, ensuring formation of sound crystals. The atomic absorption spectroscopy revealed that the content of zinc oxide in the whiskers was 99.98%.

EXAMPLE 2

Pure zinc oxide having a purity of 99.99% was sprayed in air by a melt spraying method. The resultant powder was collected and sifted to obtain particles having a size of from 30 to 50 micrometers. 1 kg of the zinc powder was charged into 500 g of ion-exchanged water and ground in the Ishikawa automated mortar for 35 minutes. Subsequently, the ground powder was allowed to stand in water at a temperature of 26° C. for 72 hours. After the standing in water, the powder was dried at 150° C. for 30 minutes to remove the water from the powder surfaces. The thus dried powder was placed in an alumina crucible, which was in turn placed in an oven maintained at 1000°±10° C. for thermal treatment for 60 minutes.

As a result, zinc oxide whiskers having an apparent bulk density of 0.09 were formed at the upper portion of the crucible with zinc oxide particles being formed at the lower portion. The rate of formation of the whiskers was 85 wt %.

The electron micrograph of the thus obtained whiskers is shown in FIG. 5. Not less than 95% by number of the whiskers were those having a tetrapod structure having a body and four needle crystal projections radially extended from the body with the balance having such structures with two and three radially extending needle crystal projections. The whiskers had a diameter of the basal part of the needle crystal projections of from 7 to 14 micrometers and a length of from the basal part to the tip of from 75 to 200 micrometers. The results of X-ray diffraction and electron beam diffraction analyses and atomic absorption spectroscopy were similar to those of Example 1.

EXAMPLE 3

Zinc powder was provided in the same manner as in Example 2 and ground in the Ishikawa automated mortar for 20 minutes, followed by allowing to stand in water at 26° C. for 72 hours. After the standing in water, the powder was dried in the same manner as in Example 1 and placed in an oven maintained at 1000°±10° C. for 60 minutes for thermal treatment.

As a result, zinc oxide whiskers were formed at the upper portion of the crucible with zinc oxide particles being formed at the lower portion deposited as a layer. The rate of the formation of the whiskers was 86 wt %.

The electron micrograph of the thus obtained whiskers is shown in FIG. 6. As will be seen from the figure, the whiskers have a tetrapod structure with a diameter of the basal part of the needle crystals of from 2 to 8 micrometers and a length of from the basal part to the tip of the crystal of from 20 to 100 micrometers.

The grinding time in this example is shorter than the time in Example 2, so that the diameter and the length are smaller than those of Example 2.

EXAMPLE 4

Zinc powder was provided in the same manner as in Example 2 and ground in the Ishikawa automated mortar for 5 minutes, followed by allowing to stand in water at a temperature of 26° C. for 72 hours. After the standing in water, the powder was dried in the same manner as in Example 1 and placed in an oven maintained at 1000°±10° C. for 60 minutes for thermal treatment.

As a result, zinc oxide whiskers were formed at a rate of 85 wt % similar to those rates of Examples 2 and 3. The whiskers had a tetrapod structure similar to the cases of Examples 2 and 3 with a diameter of the basal part of the needle crystal projection of from 0.7 to 1 micrometer and a length of the basal part to the tip of the needle crystals of from 3 to 20 micrometers. Thus, the size and the length of the whiskers are greatly influenced by the grinding time.

The zinc oxide whiskers obtained in Examples 2 to 4 were also subjected to X-ray diffraction analysis, with the result that all the peaks were those of zinc oxide. The electron beam diffraction analysis reveals that the whiskers of Examples 2 to 4 exhibit single crystallinity with little transformation and lattice defects. Moreover, the atomic absorption spectroscopy of the whiskers demonstrated that the whiskers of Examples 2 to 4 contain only a very small amount of impurities and a content of zinc oxide of 99.98%.

FIG. 7 is an electron micrograph of the whiskers obtained in Example 4.

EXAMPLE 5

The general procedure of Example 1 was repeated except that a wire of metallic zinc having a purity of 99.9% was melt sprayed in the same manner as in Example 1 to collect metallic zinc powder and that the thus collected powder was allowed to stand under conditions of a temperature of 35° C. and a relative humidity of 85% for 1 month and was dried at 100° C. for 3 hours and thermally treated at 960° C. for 45 minutes.

As a result, zinc oxide whiskers having an apparent bulk density of 0.1 were obtained at a rate of 84 wt % with the balance of zinc oxide particles.

The electron micrograph of the thus obtained whiskers is shown in FIG. 8. The four radially extending tetrapod whiskers were found to be contained in an amount of 85% by number. The results of X-ray and electron beam diffraction analyses were similar to those of Example 1.

The atomic absorption spectroscopy revealed that the content of zinc oxide was 99.96%.

EXAMPLE 6

Metallic zinc powder obtained by an atomizing method, which is one of melt granulation techniques, was provided. The powder was spherical in form with a size of from 10 to 200 micrometers. The purity of the zinc was 95.7%. 500 g of the powder was charged into 500 g of ion-exchanged water and ground in an automated mortar for 30 minutes, followed by drying at 110° C. for 2 hours and baking at 990° C. for 45 minutes in a crucible in the same manner as in Example 1. As a result, zinc oxide whiskers having an apparent bulk density of 0.08 were obtained at 91 wt % with the balance of zinc oxide particles being formed at the lower portion of the crucible. The electron micrograph of the whiskers is shown in FIG. 9. The proportion of whiskers having four radially extending needle crystal projections was about 80% by number. The results of X-ray and electron beam diffraction analyses were similar to those of Example 1. The content of zinc oxide in the whiskers was 99.81% as determined by the atomic absorption spectroscopy.

EXAMPLE 7

Metallic zinc powder was prepared by a graining method, which is one of melt cooling granulation techniques, in which the zinc melt was brought to contact with air at a temperature near the solidification temperature of zinc and violently stirred. The resultant powder had a purity of 95.4% with a size of from 10 to 250 micrometers. The powder was allowed to stand at a relative humidity of 50% in air for one week, followed by addition of 70 g of water to 100 g of the powder and allowing to stand for 72 hours for aging. Thereafter, the mixture was dried at 100° C. for 45 minutes and baked in an oven of 970° C. for 1 hour.

As a result, zinc oxide whiskers having an apparent bulk density of 0.15 was obtained in an amount of 79 wt % with the balance of zinc oxide particles. The electron micrograph of the whiskers is shown in FIG. 10. The whiskers having a tetrapod form was contained in an amount of 74% by number. The results of X-ray and electron beam diffraction analyses were similar to those of Example 1. The content of zinc oxide in the whiskers was 99.97 wt % as determined by the atomic absorption spectroscopy.

EXAMPLE 8

Metallic zinc powder was prepared by spraying a melt of metallic zinc into water by a liquid atomizing method. The purity of the powder was 96.7% with a size of from 1 to 100 micrometers. Immediately after the preparation, 80 g of water was added to 100 g of the powder, followed by grinding in an automated mortar for 2 hours. The mixture was dried at 150° C. for 1 hour without aging by allowing the powder to stand, followed by baking at 1000° C. for 40 minutes. As a result, zinc oxide whiskers having an apparent bulk density of 0.08 were obtained in an amount of 93 wt % with the balance of zinc oxide particles. The electron micrograph of the whiskers is shown in FIG. 11. The content of the tetrapod-shaped whiskers was about 94% by number. The content of zinc oxide in the whiskers was 99.94% as determined by the atomic absorption spectroscopy.

EXAMPLE 9

Metallic zinc powder was obtained by a mechanical technique in which an Zn ingot was cut in water and roughly crushed five times by means of a jaw crusher while immersing in water, followed by immersion in water for 12 hours and division into fine pieces. Thereafter, the fine pieces were aged in water at 29° C. for 2 days. The powder had a purity of 90% and a size of from 10 to 100 micrometers. The powder was dried at 100° C. for 2 hours and baked at 980° C. for 50 minutes.

As a result, zinc oxide whiskers having an apparent bulk density of 0.10 were obtained in an amount of 87 wt % with the balance of zinc oxide particles. The electron micrograph of the whiskers is shown in FIG. 12. The whiskers of the tetrapod form having four radially extending projections are contained in an amount of about 91% by number of the whisker product. The results of X-ray and electron beam diffraction analyses were similar to those of Example 1. As a result of the atomic absorption spectroscopy, the content of zinc oxide was found to be 99.89 wt % of the whiskers.

EXAMPLE 10

A wire of metallic zinc having a purity of 99.5 wt % was cut into pieces having a length of 20 mm and and milled in a vortex mill in coexistence of water for 12 hours. The resultant powder had a size of from 15 to 300 micrometers. The powder was dried at 1250° C. for 1 hour and baked or thermally treated at 1000° C. for 1 hour. As a result, zinc oxide whiskers having an apparent bulk density of 0.09 were obtained in an amount of 90 wt % with the balance of zinc oxide particles. The electron micrograph of the whiskers is shown in FIG. 13. The whiskers of the tetrapod form having four radially extending projections were obtained in an amount of about 90% by number of the whisker product. The results of the X-ray and electron beam diffraction analyses were similar to those of Example 1. The atomic absorption spectroscopy revealed that the whiskers were made of 99.71 wt % of zinc oxide.

EXAMPLE 11

The zinc oxide whiskers of the tetrapod form obtained in Example 1 were mixed with an ABS resin and subjected to measurement of mechanical characteristics to determine a reinforcing effect of the zinc oxide whiskers.

Test pieces of a cross form having a 5 mm square center portion with a longitudinal length of 50 mm and a transverse length of 50 mm were made using resin compositions having different amounts of the zinc oxide whiskers. The test pieces were each subjected to measurement of a tensile strength. The results are shown in the following Table.

TABLE

| Amount of ZnO (Vol %) | Tensile Strength Longitudinal Direction | (relative index) Transverse Direction |
|---|---|---|
| 0 | 100 | 100 |
| 10 | 105 | 104 |
| 15 | 121 | 122 |
| 20 | 203 | 200 |

As will become apparent from the above results, the tensile strength increases with an increase in amount of the zinc oxide whiskers. Thus, the whiskers has a great reinforcing effect. Moreover, the tensile strengths along the longitudinal and transverse directions are substantially equal, thus the whiskers being not anisotropic with respect to the mechanical strength. This is completely different from known needle crystal whiskers, from which the effect of the whiskers of the tetrapod form according to the invention is unique as having never been expected from the known counterparts.

In the above example, one application of the whiskers of the invention is described. In practice, the whiskers of the invention can be applied to various fields as a reinforcing material such as for metals, ceramics, rubbers, paints and the like. In addition, the whiskers having a steric structure having radially extending needle crystal projections may be applied to as a porosity-imparting material, a paint sag preventing material, an electromagnetic waver-shielding material, an antistatic agent and the like and may also be applied to various electronic materials or parts. Since the zinc oxide is white in color, the whiskers may be applied to as white pigments.

COMPARATIVE EXAMPLE 1

The general procedure of Example 1 was repeated except that the thermal treatment was effected at 500° C. for 1 hour. As a result, it was found that no whiskers were formed but zinc oxide particles were obtained. The electron micrograph of the product is shown in FIG. 14.

COMPARATIVE EXAMPLE 2

The general procedure of Example 1 was repeated except that the thermal treatment was effected at 1550° C. for 20 minutes. The resultant product was mainly composed of a sintered product of zinc oxide with deformed needle whiskers being found locally in the sintered product. The deformed needle whiskers were not those of the tetrapod form. The electron micrograph of the product is shown in FIG. 15.

COMPARATIVE EXAMPLE 3

The general procedure of Example 6 was repeated except that the grinding with the automated mortar for 30 minutes was omitted. When the resultant zinc powder was baked under the same conditions as in Example 6, the baking did not proceed uniformly, so that the resultant product was a mixture of zinc oxide particles and metallic zinc with whiskers of a deformed tetrapod form being found on the surfaces of the mixture in small amounts. The electron micrograph of the product is shown in FIG. 16.

COMPARATIVE EXAMPLE 4

The general procedure of Example 1 was repeated except that the treatment with the automated mortar was omitted. As a result, there was obtained a mixture of zinc oxide particles and metallic zinc with only a small amount of a whisker-like product being observed on the surfaces of the mixture. However, a whisker-like product with a tetrapod form was very small in amounts. The electron micrograph of the product is shown in FIG. 17.

COMPARATIVE EXAMPLE 5

The general procedure of Example 1 was repeated except that the aging step was omitted. The resultant product was similar to that of Comparative Example 1. The electron micrograph of the product is shown in FIG. 18.

COMPARATIVE EXAMPLE 6

The general procedure of Example 4 was repeated except that the metallic zinc powder was allowed to stand at a temperature of 20° C. in a dry nitrogen gas atmosphere for one day. The resultant product was similar to that of Comparative Example 4.

From the comparative examples, it will be seen that the zinc powders used in these comparative examples are not formed with an oxide film thereon, so that whiskers of a tetrapod form are not formed.

Although not specifically shown in the examples, when the zinc oxide whiskers of the invention are applied as a reinforcing agent for various materials and particularly electronic materials, the resultant product does not exhibit anisotropy not only in mechanical properties, but also in electric and chemical characteristics. Since the whiskers of the invention are significantly larger in size than known fine needle crystals of zinc oxide, the reinforcing effect is far greater when the whiskers are used in combination with resin, metals or ceramics. In addition, the zinc oxide whiskers of the invention can be prepared more inexpensively than known silicon carbide, silicon nitride and the like whiskers used for the same purposes.

As will be apparent from the examples described above, the method of the invention is advantageous in that the size of whiskers can be arbitrarily controlled by controlling the conditions for the mechanical grinding or milling in water, aging, drying and/or baking.

What is claimed is:

1. A method for preparing whiskers of zinc oxide which comprises providing a metallic zinc powder having an oxide film on the surfaces thereof, and thermally treating said metallic zinc powder in an atmosphere containing molecular oxygen under thermal treatment conditions sufficient to form a product comprising whiskers of zinc oxide having a crystal form including a central body and four needle crystal projections extending from the central body.

2. A method according to claim 1, wherein said product comprises a major proportion of whiskers of zinc oxide having a crystal structure including a central body and four needle crystal projections extending from the central body.

3. A method according to claim 1, wherein the product is formed in the place where the zinc powder has been provided.

4. A method according to claim 1, wherein said product is a mixture of the whiskers of zinc oxide and particles of zinc oxide formed below the whiskers.

5. A method according to claim 4, wherein said whiskers are separated from said particles.

6. A method according to claim 1, wherein the thermal treatment conditions include a temperature of from 700° to 1300° C. for a time of from 20 to 120 minutes.

7. A method according to claim 6, wherein the thermal treatment conditions comprise heating said metallic zinc powder to a temperature of from 700° to 1300° C. over a corresponding period of time from 120 to 20 minutes.

8. A method according to claim 1, wherein the thermal treatment conditions include a temperature of from 900° to 1100° C. for a time of from 30 to 90 minutes.

9. A method according to claim 8, wherein the thermal treatment conditions comprise heating said metallic zinc powder to a temperature of from 900° to 1100° C. over a corresponding period of time from 90 to 30 minutes.

10. A method according to claim 1, wherein said atmosphere is an atmosphere of air.

11. A method according to claim 1, wherein said atmosphere is an atmosphere of oxygen and nitrogen having an oxygen content of from 0.01 to 11 vol %.

12. A method according to claim 1, further comprising milling the whiskers to form needle crystals of zinc oxide having a diameter of from 1 to 10 micrometers.

13. A product obtained by the method of claim 12.

14. A method according to claim 1, wherein said metallic zinc powder having the oxide film on the surfaces thereof is obtained by grinding a metallic zinc powder in coexistence of water under conditions sufficient to form the oxide film on the powder surfaces, and drying the powder.

15. A method according to claim 14, wherein the second-mentioned metallic zinc powder has a size of from 0.1 to 500 micrometers.

16. A method according to claim 14, wherein the metallic zinc powder is ground for a period of time of at least 20 minutes.

17. A method according to claim 14, wherein the grinding is effected by the use of an automated mortar.

18. A method according to claim 14, further comprising, after the grinding, allowing the ground powder to age in water at not lower than 20° C. for at least 24 hours.

19. A method according to claim 18, wherein the aging time is at least 72 hours.

20. A method according to claim 1, wherein said metallic zinc powder having the oxide film on the surfaces thereof is obtained by allowing a metallic zinc powder to age in coexistence of water under conditions sufficient to form the oxide film on the powder surfaces, and drying the powder.

21. A method according to claim 20, wherein the conditions comprise maintaining said metallic zinc powder and water at a temperature of not lower than 24° C. over a period of time not shorter than 24 hours.

22. A method according to claim 21, wherein the time is not shorter than 72 hours.

23. A method according to claim 1, wherein said metallic zinc powder having the oxide film on the surfaces thereof is obtained by mechanically grinding a metallic zinc powder under grinding stress and temperature conditions in an oxidative atmosphere whereby the oxide film is formed.

24. A method according to claim 1, wherein said metallic zinc powder having the oxide film on the surfaces thereof is obtained by a melt spraying method of metallic zinc in an oxidative atmosphere whereby the oxide film is formed.

25. A composition of matter comprising individual whisker particles of zinc oxide whose crystal form includes a central body and four needle crystal projections radially extending from said central body with each projection having a length of from 10 to 300 micrometers.

26. A composition of matter according to claim 25, wherein the length of the projections is in the range of from 30 to 200 micrometers.

27. A composition of matter according to claim 25, wherein the four needle crystal projections each has a diameter of from 0.5 to 14 micrometers at a base thereof.

28. A composition of matter according to claim 27, wherein the diameter of each of the four needle crystal projections is in the range of from 1 to 14 micrometers.

29. A composition of matter according to claim 27, wherein the diameter of each of the four needle crystal projections is in the range of from 1.5 to 14 micrometers.

30. A composition of matter according to claim 25, wherein said whisker particles are in the form of a mixture which comprises different sizes of whiskers of zinc oxide having a crystal form which includes a central body and four needle crystal projections radially extending from said central body with each projection having a length of from 10 to 300 micrometers.

31. A composition of matter according to claim 25, wherein said whisker particles consist of a mixture comprising whisker particles of zinc oxide having a crystal structure which includes a central body and four needle crystal projections radially extending from said central body and other whisker particles of zinc oxide whose crystal structure includes a central body and at least two, three or greater than four needle crystal projections radially extending from said central body.

32. A composition of matter according to claim 31, wherein said other whisker particles of zinc oxide include particles or mixtures thereof having two, three or five needle crystal projections which extend from the central bodies.

33. A composition of matter according to claim 25, wherein adjacent one of said four needle crystal projections form an angle of approximately 109 degrees.

34. A composition of matter which comprises whisker particles of zinc oxide having a tetrapod form as illustrated in any one of FIGS. 5 to 13.

35. A whisker material which comprises individual whisker particles of zinc oxide whose crystal form includes a central body and four needle crystal projections radially extending from said central body with each projection having a length of from 10 to 300 micrometers.

36. A whisker material according to claim 35, wherein the length of the projections is in the range of from 30 to 200 micrometers.

37. A whisker material according to claim 35, wherein the four needle crystal projections each has a diameter of from 0.5 to 14 micrometers at a base thereof.

38. A whisker material according to claim 37, wherein the diameter of each of the four needle crystal projections is in the range of from 1 to 14 micrometers.

39. A whisker material according to claim 37, wherein the diameter of each of the four needle crystal projections is in the range of from 1.5 to 14 micrometers.

40. A whisker material according to claim 35, wherein said whisker particles are in the form of a mixture which comprises different sizes of whiskers of zinc oxide having a crystal form which includes a central body and four needle crystal projections radially extending from said central body with each projection having a length of from 10 to 300 micrometers.

41. A whisker material according to claim 35, wherein said whisker particles consist of a mixture comprising whisker particles of zinc oxide having a crystal structure which includes a central body and four needle crystal projections radially extending from said central body and other whisker particles of zinc oxide whose crystal structure includes a central body and at least two, three or greater than four needle crystal projections radially extending from said central body.

42. A whisker material according to claim 41, wherein said other whisker particles of zinc oxide include particles or mixtures thereof having two, three or five needle crystal projections which extend from the central bodies.

43. A whisker material according to claim 35, wherein adjacent ones of said four needle crystal projections form an angle of approximately 109 degrees.

44. A whisker material which comprises whisker particles of zinc oxide having a tetrapod form as illustrated in any one of FIGS. 5 to 13.

45. A product obtained by a process which comprises providing a metallic zinc powder having an oxide film on the surfaces thereof and thermally treating said metallic zinc powder in an atmosphere containing molecular oxygen under thermal treatment conditions sufficient to form a product comprising whisker particles of zinc oxide having a crystal form including a central body and four needle crystal projections extending from the central body with each projection having a length of from 10 to 300 micrometers.

46. A product according to claim 45, wherein said product comprises a major proportion of whisker particles of zinc oxide having a crystal structure including a central body and four needle crystal projections extending from the central body.

47. A product according to claim 45, wherein the product is formed in the place where the zinc powder has been provided.

48. A product according to claim 45, wherein said product is a mixture of the whisker particles of zinc oxide and other particles of zinc oxide formed below the whisker particles.

49. A product according to claim 48, wherein said whisker particles are separated from said other particles.

50. A product according to claim 45, wherein the thermal treatment comprises heating said metallic zinc powder to a temperature of from 700° to 1300° C. for a period of time from 20 to 120 minutes.

51. A product according to claim 50, wherein the thermal treatment comprises heating said metallic zinc powder to a temperature of from 700° to 1300° C. over a corresponding period of time from 120 to 20 minutes.

52. A product according to claim 45, wherein the thermal treatment comprises heating said metallic zinc powder to a temperature of from 900° to 1100° C. for a period of time from 30 to 90 minutes.

53. A product according to claim 52, wherein the thermal treatment comprises heating said metallic zinc powder to a temperature of from 900° to 1100° C. over a corresponding period of time from 90 to 30 minutes.

54. A product according to claim 45, wherein said atmosphere includes air.

55. A product according to claim 45, wherein said atmosphere includes oxygen and nitrogen with an oxygen content of from 0.01 to 11 vol. %.

56. A product according to claim 45, further comprising milling the whisker particles to form needle crystals of zinc oxide having a diameter of from 1 to 10 micrometers.

57. A product according to claim 45, wherein said metallic zinc powder having the oxide film on the surfaces thereof is obtained by grinding a metallic zinc powder in the presence of water under conditions sufficient to form said oxide film on the powder surfaces and thereafter drying the powder.

58. A product according to claim 57, wherein the metallic zinc powder has a size of from 0.1 to 500 micrometers before said grinding step.

59. A product according to claim 57, wherein the grinding is conducted in an automated mortar.

60. A product according to claim 57, further comprising, after grinding, allowing the ground powder to age in water at a temperature of not lower than 20° C. for at least 24 hours.

61. A product according to claim 60, wherein the aging time is at least 72 hours.

62. A product according to claim 45, wherein said metallic zinc powder having the oxide film on the surfaces thereof is obtained by allowing a metallic zinc powder to age in the presence of water under conditions sufficient to form the oxide film on the powder surfaces and thereafter drying the powder.

63. A product according to claim 45, wherein said metallic zinc powder having the oxide film on the surfaces thereof is obtained by a melt spraying method in which metallic zinc is melt sprayed in an oxidative atmosphere whereby the oxide film is formed.

* * * * *